United States Patent [19]
Reynolds

[11] Patent Number: 5,619,172
[45] Date of Patent: Apr. 8, 1997

[54] HIGH IMPEDANCE RATIO WIDEBAND TRANSFORMER CIRCUIT

[75] Inventor: Robert L. Reynolds, Platteville, Colo.

[73] Assignee: Vari-L Company, Inc., Denver, Colo.

[21] Appl. No.: 527,861

[22] Filed: Sep. 14, 1995

[51] Int. Cl.⁶ .................. H03H 7/42; H03H 7/38
[52] U.S. Cl. ........................... 333/25; 333/32
[58] Field of Search .................. 333/25, 32, 119, 333/131; 336/221, 233

[56] References Cited

U.S. PATENT DOCUMENTS

| | | | |
|---|---|---|---|
| 3,244,998 | 4/1966 | Broadhead, Jr. | 330/306 |
| 3,882,432 | 5/1975 | Bowman et al. | 333/32 |
| 4,201,962 | 5/1980 | Hosoya | 333/32 X |
| 5,051,710 | 9/1991 | Kaltenecker | 333/32 |
| 5,216,393 | 6/1993 | Wandel | 333/32 |
| 5,309,120 | 5/1994 | Koontz | 333/32 |
| 5,495,212 | 2/1996 | DeCramer | 333/25 |

*Primary Examiner*—Paul Gensler
*Attorney, Agent, or Firm*—Ancel W. Lewis, Jr.

[57] ABSTRACT

A transformer circuit disclosed performs wideband impedance transformation (matching) and can be used for voltage step-up and step-down applications. The circuit disclosed is comprised of two transmission line transformers and two reactive impedances that compensate the circuit for impedance versus frequency. The circuit disclosed performs a very wideband impedance ratio of 1:9. The circuit may have different turns ratios for T1 and T2 and different values for Z1 and Z2 to accommodate rational, fractional and integer values of transformation up to an impedance ratio of 16:1. The addition of a balun to the output provides a balanced output.

26 Claims, 3 Drawing Sheets

HIGH IMPEDANCE RATIO WIDEBAND TRANSFORMER CIRCUIT

TECHNICAL FIELD

This invention relates to impedance transformers and more particularly to high impedance ratio transformer circuits operable at a higher wide range of frequencies on the order of 5 MHz to 1.2 GHz.

BACKGROUND ART

Conventional single core autotransformers (also known as transmission line transformers) are well known in the electronics industry for impedance or voltage step-up and step-down applications. Autotransformers are known to work fairly well up to 1 GHz with an impedance ratio of 4:1 or less. At higher impedance ratios of greater than 4:1, however, the high frequency response is limited by the length of the windings as they approach a quarter wavelength and thereby induce a resonance. More specifically, the higher ratio impedance transformer's performance is limited by the electrical length of the secondary windings.

Broadhead, Jr. U.S. Pat. No. 3,244,998 discloses an impedance transformer circuit using a single toroid core that is suitable for operating up to about 80 MHz.

Wandel U.S. Pat. No. 5,216,393 discloses an impedance transformer circuit in which a double aperture ferrite core is used as well as an autotransformer having the first and second windings twisted together and wrapped through the apertures of the double ferrite aperture core. This patent discloses performance within a band width from 47 MHz up through 860 MHz.

DISCLOSURE OF THE INVENTION

In accordance with the present invention there is provided a transformer circuit having two transmission line transformers with the first winding of the first transformer connected to a low impedance port and a second winding of the first transformer connected to the first winding of a second transformer via a first reactive impedance with the second winding of the second transformer connected to a high impedance port. The transformers shown are wound on a double aperture ferrite core and utilize a twisted pair configuration between the primary and secondary windings. A second reactive impedance is connected between the low impedance port and ground. The magnitude of the first and second impedances are balanced to give a response in which impedance ratios of about 9:1 to 16:1 and frequency responses from about 5 MHz to 1.2 GHz may be achieved. The addition of an unbalanced to a balanced transmission line transformer known as a balun and specifically a 1:1 balun connected to the output provides an unbalanced input to a balanced output.

BRIEF DESCRIPTION OF THE DRAWINGS

Details of this invention are described in connection with the accompanying drawings which like parts bear similar reference numerals in which.

DETAILED DESCRIPTION

Figure 1:
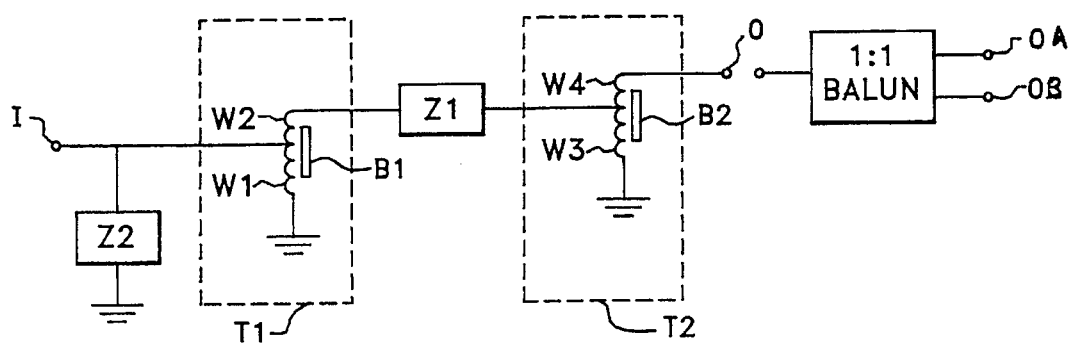
FIG. 1 is a basic electrical schematic circuit diagram of a high impedance ratio wideband transformer circuit embodying features of the present invention.

Referring now to FIG. 1 there is shown a basic high impedance ratio wideband transformer circuit embodying features of the present invention including a first transformer T1 having a first winding W1 connected to a low impedance port I and having a second winding W2. The first and second windings W1 and W2 are wound on a core B1 with the windings inductively coupled to one another. There is also provided a second transformer T2 having a first winding W3 and a second winding W4. The second winding W2 of the first transformer T1 is connected to the first winding W3 of the second transformer T2 via a first reactive impedance Z1. The first and second windings W3 and W4 are wound on a core B2 with the windings inductively coupled to one another. The second winding W4 of the second transformer T2 is connected to a high impedance port O. A second reactive impedance Z2 is connected between the low input port I and ground. The output O is an unbalanced output. A 1:1 balun may be connected to the output O of the transformer circuit to provide a balanced output at terminals OA and OB.

Figure 2:
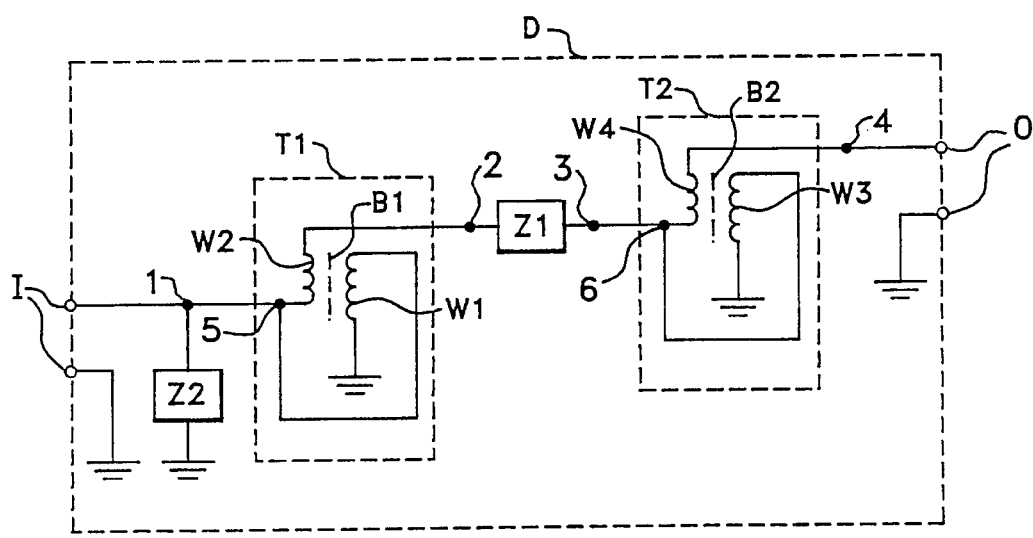
FIG. 2 is a more detailed electrical circuit diagram of the basic circuit shown in FIG. 1.

Referring now to FIG. 2 a more detailed diagram of the transformer circuit of the present invention is shown and is designated by letter D. Transformer circuit D is shown as having a pair of input terminals I and a pair of output terminals O. The first reactive impedance Z1 is connected in series between nodes 2 and 3, respectively, and the second reactive impedance Z2 is connected between node 1 and ground. A reactive impedance is an impedance whose reactance changes with frequency. Reactive impedances Z1 and Z2 provide compensation for impedance versus frequency in the circuit. First winding W1 has one side connected to ground and the other side connected to node 5 which is also connected to node 1. Second winding W2 has one side connected to node 5 and the other side connected to node 2. The second reactive impedance Z2 is connected between node 1 and ground. The second transformer T2 has a first winding W3 connected between ground and node 6. The second winding W4 of transformer T2 is connected between node 6 and node 4 which is connected to an output terminal O.

More specifically, the transformer T1 is connected as an autotransformer with first winding W1 being a primary winding and second winding W2 being a secondary winding. Similarly, transformer T2 is connected as an autotransformer with first winding W3 being a primary winding and winding W4 being a secondary winding.

Figure 3:
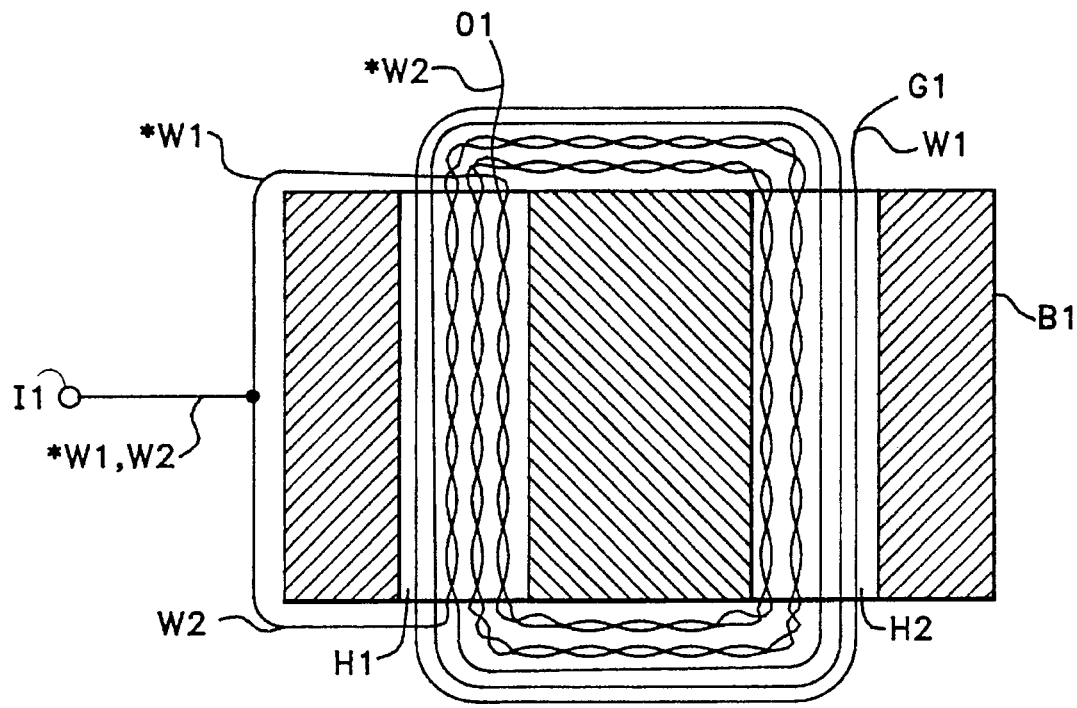
FIG. 3 is a sectional view of the first transformer shown in FIGS. 1 and 2.

Generally stated, transformers T1 and T2 are transmission line transformers. Referring now to FIG. 3 there is shown a transformer T1 found suitable to practice the present invention and is later referred to herein in more detail in Example 1. Transformer T1 has a miniature double aperture ferrite core having a rectangular core body B1 with rounded ends and having a pair of spaced apertures H1 and H2 formed in the core body. There is shown in FIG. 3 two and one half (2.5) turns of twisted wire designated wires W1 and W2 which are wound on core body B1 through apertures H1 and H2 and the wire is then separated. At the point of separation wire *W2 is designated wire W2. Wire *W1 is wound two and a half turns more and is designated wire W1. Wires *W1 and W2 are then connected to form a center tap which is the input to the transformer T1 and specifically is connected to the ungrounded side of winding W1 and is designated I1. Wires *W2 and W1 are designated O1 and G1, respectively, for the transformer. The transformer T1 is installed in the circuit such that I1 is node 5 and O1 is node 2 and G1 is grounded as shown in FIG. 2. The primary winding W1 of T1 then has 5 turns and the secondary winding W2 of T1 has seven and one half (7.5) turns.

Figure 7A:
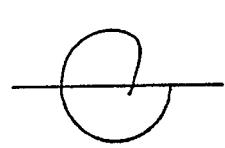
FIG. 7A is a representation of reactive impedance on the Smith chart showing the response of the circuit if the second reactive impedance is excessive.
Figure 7B:
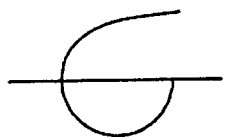
FIG. 7B is a representation of reactive impedance on the Smith chart showing the response of the circuit if the second reactive impedance is insufficient.
Figure 7C:
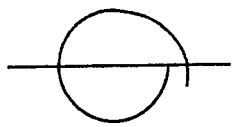
FIG. 7C is a representation of reactive impedance on the Smith chart showing the response of the circuit if the first reactive impedance is excessive.
Figure 7D:
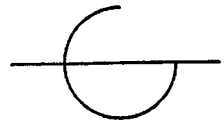
FIG. 7D is a representation of reactive impedance on the Smith chart showing the response of the circuit if the first reactive impedance is insufficient.
Figure 7E:
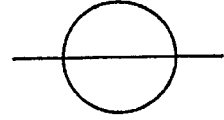
FIG. 7E is a representation of reactive impedance on the Smith chart showing the correct balance of the first and second reactive impedances which is the desired response for the circuit.

A reactive inductance Z1 found suitable for practicing the present invention is a single strand of enamel coated magnet wire of which the gauge is not critical provided the wire is wound on a phenolic toroid core. With this structure the inductance of the inductor can be adjusted to close the loop as shown in FIG. 7E.

Figure 4:
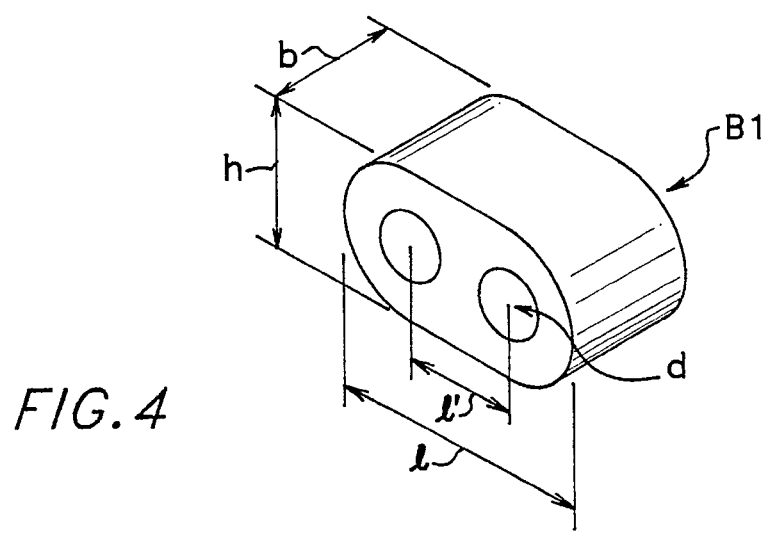
FIG. 4 is a perspective view of the core shown in FIG. 3 showing the locations of the core dimensions for reference purposes.

The locations of the dimensions on the core B1 are shown in FIG. 4 for reference purposes and are designated as width "b", height "h", diameter of apertures "d", distance between centers of the apertures l' and length of the core "l".

Figure 5:
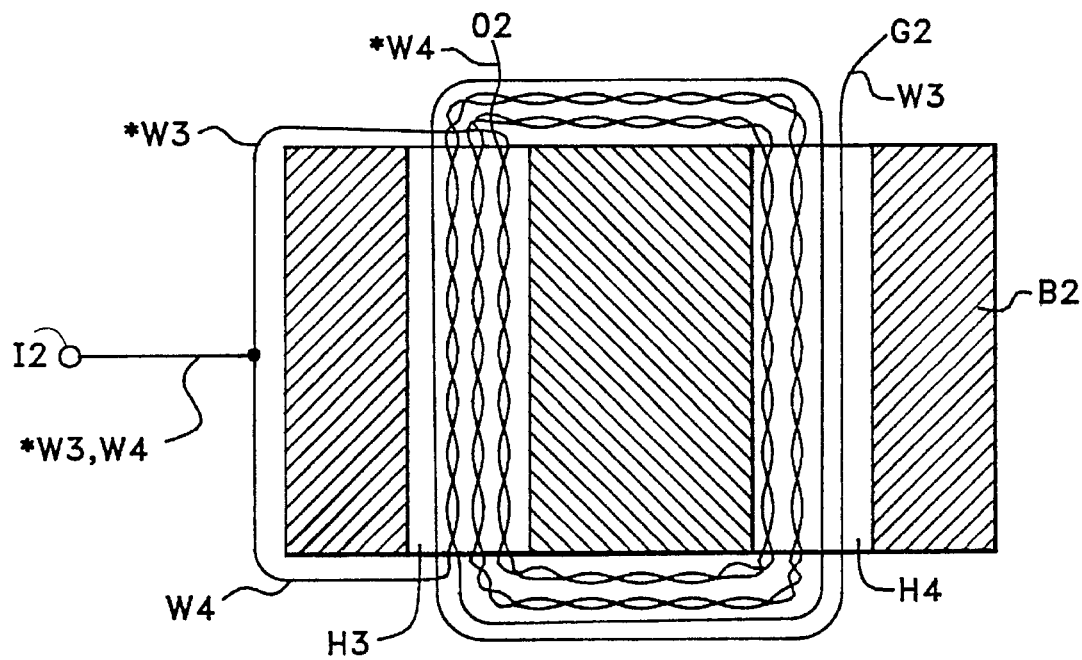
FIG. 5 is a sectional view of the second transformer shown in FIGS. 1 and 2.

Referring now to FIG. 5 transformer T2 is similar in construction to transformer T1 previously described. There is shown in FIG. 5 a twisted pair of separate wires designated *W3 and *W4. Two and a half turns of the twisted wire are wound on the double aperture core B2 through apertures H3 and H4. The wires are then separated. At the point of separation wire *W4 is designated wire W4. Wire *W3 is wound one and a half turns more and designated W3. Wires *W3 and W4 are then connected to form a center tap which is the input to the transformer designated I2. Wires *W4 and W3 are designated O2 and G2, respectively. The circuit is arranged so that with reference to FIG. 2 I2 is node 6 and O2 is node 4 and G2 is grounded. The primary winding W3 of T2 has four turns and the secondary winding W4 of T2 has six and one half (6.5) turns.

Figure 6:
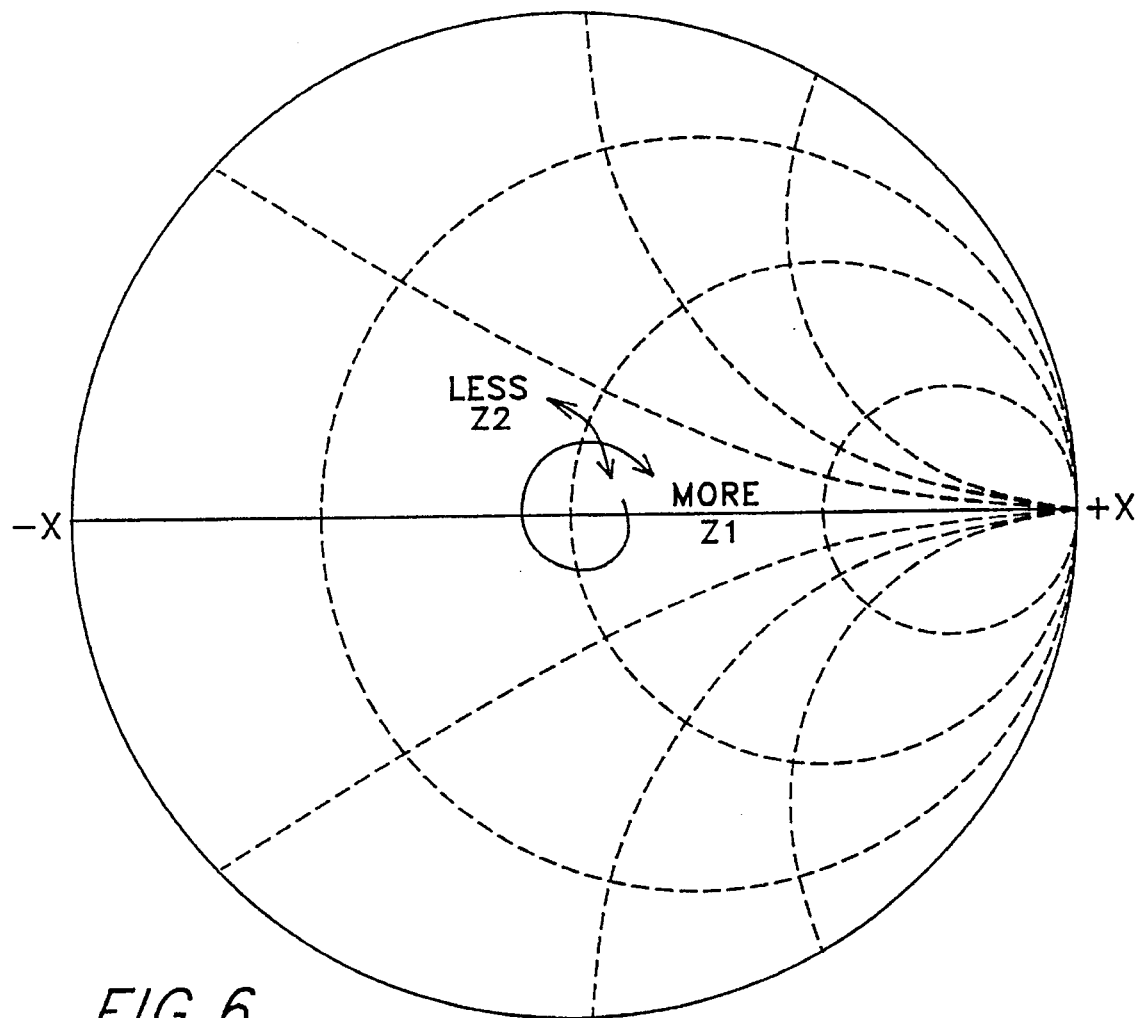
FIG. 6 is a Smith chart showing the composite contribution of the impedances in the circuit for the transformer circuit shown in FIGS. 1–5.

Referring now to FIG. 6 the Smith chart shown is a graph having real impedance plotted along a horizontal axis with increasing impedance designated +X being to the right and at one end being infinite impedance (open circuit) and decreasing impedance designated −X to the left and at the other end being minimum (short circuit). Inductive reactance is above the axis and capacitive reactance is below the axis. Constant resistance is indicated on the diagram as a dashed line intersecting the horizontal axis. The effect of changing reactive impedance Z1 is indicated in the direction of the arrow and less reactive impedance Z1 in the direction opposite the arrow. The effect of changing reactive impedance Z2 is indicated with more reactive impedance Z2 and less reactive impedance Z2. The desired response is a perfect circle with a minimum diameter central about the locus indicating the desired match between input and output impedances.

Referring now to FIGS. 7A through 7E, 7A shows a circuit response if reactive impedance Z2 is excessive, 7B shows the circuit response if reactive impedance Z2 is insufficient, 7C shows the circuit response if reactive impedance Z1 is excessive, 7D shows the circuit response if reactive impedance Z1 is insufficient and 7E shows the correct balance of reactive impedance Z1 and Z2 which is the desired response of the circuit.

In general, implementation of the circuit dictates that transformer T1 and transformer T2 (and balun for the balanced output) must be designed such that they perform satisfactorily independently. It is well known that the $A_L$ ($L_P$) parameter for the core in conjunction with the numbers of turns on the low impedance side of a transformer dictates the low frequency performance.

Inherent in all transformers wound on a core is a component resistance Rp (parallel resistance associated with core loss and is material dependent) that must be considered in all transformer designs. Ideally the value of resistance Rp would be infinite for minimum loss, but in reality has some finite value and must be considered. Resistance Rp which is a function of the number of turns squared is critical for transformer T2 if the circuit is used in an impedance step up configuration but is also an important consideration with respect to transformer T1. For example, if the circuit is configured as a 9:1 step up transformer and the input and output impedances are 50 and 450 ohms, respectively, then the resistance Rp of the transformer T2 secondary must be at least 3 to 4 times the value of the output impedance at point 0 to minimize insertion loss.

Referring to FIG. 2, the resistance Rp of transformer T1 would be a resistor connected from node 2 to ground (in parallel with the secondary of transformer T1). Since resistance Rp is a function of the core material and the number of turns of wire on the secondary of the transformer, it is therefore not shown in the figure as an additional component. The resistance Rp of transformer T2 would be a resistor connected from node 4 to ground (in parallel with the secondary of transformer T2). As with transformer T1, resistance Rp is a function of the core material and the number of turns of wire on the secondary of the transformer and therefore is not shown in the figure as an additional component.

Resistance Rp is an important consideration in overall design of the circuit since the resistance Rp of transformer T2 is in parallel with the load that would be connected to point 0. This effectively lowers the impedance at node 4. In addition, the same phenomenon is present at node 2 of transformer T1 and has the same effect on transformer T1. With the ratio multiplying nature of the embodiment, the overall effect is that the resultant input impedance at I is lower than the expected 9:1. Referring to FIG. 6, the lower impedance shifts the response in the −X direction on the Smith chart.

In the circuit shown and described transformers T1 and T2 in general compensate for the lower equivalent impedance seen at I by decreasing the impedance step-up ratio of transformers T1 and T2. Decreasing the impedance step-up ratio of transformers T1 and T2 shifts the circuit response in the +X direction of FIG. 6. In summary, the change of the turns ratio is used to shift the circuit response to the right and correct for the lower equivalent impedance seen at I.

While two transformers connected in series and with the reactive impedances Z1 and Z2 as shown has been found to provide higher impedance ratios over a wider range of frequencies, it is understood that the same principle may be used employing only a single transformer. For example, only reactive impedances Z1 and Z2 with transformer T1 may be used with the output at node 3. This circuit would have lower impedance ratios but the Smith chart, balancing of the reactive impedances and adjustment of turns on the transformers would be the same.

EXAMPLE 1

The impedance and the characteristics of the transformers that provide a 1:9 impedance ratio and bandwidth of about 5 MHz to 1.2 GHz are summarized as follows:

```
Z1 = Inductor = 2.7 nanohenries
Z2 = Capacitor = 1.0 picofarad
*W1 and *W2 = 2.5 turns
W1 = 5 turns
W2 = 7.5 turns
W3 = 4 turns
W4 = 6.5 turns
Core Rp for T1 and for T2 = 32 ohms/turns squared
Core dimensions    l = 2.70 mm
                   l' = 1.35 mm
                   h = 1.30 mm
                   d = 0.50 mm
Core material   82 material of Krystinel
Rp for T1 =   (W2)² × Core Rp
              (7.5)² × (32) = 1800 ohms
Rp for T2 =   (W4)² × (32)
              (6.5)² × (32) = 1352 ohms
Where   I = 50 ohms
        O = 450 ohms
Where   I = 50 ohms
Z at node 2 = 150 ohms
Z at node 4 = 450 ohms
Impedance ratio 1:9
```

EXAMPLE 2

The impedances and the characteristics of the transformers that provide a 1:12 impedance ratio and a bandwidth of about 10 MHz to 1000 MHz are summarized as follows:

```
Z1 = Inductor = 2.7 nanohenries
Z2 = Capacitor = 1.8 picofarad
*W1 and *W2 for T1 = 2.0 turns
*W1 and *W2 for T2 = 2.5 turns
W1 = 4.5 turns
W2 = 6.5 turns
W3 = 3.0 turns
W4 = 5.5 turns
Core Rp for T1 = 32 ohms/turns squared
Core Rp for T2 = 80 ohms/turns squared
Core dimensions for T1    l = 2.70 mm
                          l' = 1.35 mm
                          h = 1.30 mm
                          d = 0.50 mm
Core dimensions for T2    l = 3.5 mm
                          l' = 1.40 mm
                          h = 2.06 mm
                          d = .76 mm
Core material for T1   82 material of Krystinel
Core material for T2   81 material of Krystinel
Rp for T1 =   (W2)² × Core Rp
              (6.5)² × (32) = 1352 ohms
Rp for T2 =   (W4)² × Core Rp
              (5.5) × (80) = 2420 ohms
```

EXAMPLE 3

The impedances and the characteristics of the transformers that provide a 1:16 impedance ratio and a bandwidth of about 10 MHz to 600 MHz are summarized as follows:

```
Z1 = Inductor = 4.8 nanohenries
Z2 = Capacitor = 2.2 picofarads
*W1 and *W2 for T1 = 1.5 turns
*W1 and *W2 for T2 = 2.5 turns
W1 = 4.5 turns
W2 = 6.0 turns
W3 = 2.5 turns
W4 = 5.0 turns
Core Rp for T1 = 32 ohms/turns squared
Core Rp for T2 = 80 ohms/turns squared
Core dimensions for T1    l = 2.70 mm
                          l' = 1.35 mm
                          h = 1.30 mm
                          d = 0.50 mm
Core dimensions for T2    l = 3.5 mm
                          l' = 1.40 mm
                          h = 2.06 mm
                          d = 0.76 mm
Core material for T1   82 material of Krystinel
Core material for T2   81 material of Krystinel
Rp for T1 =   (W2)² × Core Rp
              (6.0)² × (32) = 1080 ohms
Rp for T2 =   (W4)⁴ × Core Rp
              (5.0)² × (80) = 2000 ohms
```

It is understood the above described circuits can be used for step-down applications by using the output 0 as an input.

Although the present invention has been described with a certain degree of particularity, it is understood that the present disclosure has been made by way of example and that changes in details of structure may be made without departing from the spirit thereof.

What is claimed is:

1. A high impedance ratio wideband transformer circuit comprising:

transmission line transformer means having a first port and a second port, said transmission line transformer means including first and second transmission line transformers connected in series so that the impedance ratio of said first transmission line transformer is multiplied by the impedance ratio of said second transmission line transformer to reduce the length of said secondary windings of said transmission line transformers thereby increasing the range of frequency, a first reactive impedance connected between said first and second transmission line transformers, and a second reactive impedance connected at said first port with the values of said first and second reactive impedances being selected to optimize an impedance match from said first port to said second port for a selected turns ratio of said transmission line transformer means and a desired transformation ratio and frequency response to provide a transformation ratios of above about 4:1 over a range of frequencies of about 5 MHz to 1.2 MHz.

2. A transformer circuit as set forth in claim 1, said first transformer having a first winding connected to a low impedance port and having a second winding inductively coupled to said first winding, said second transformer having a first winding and a second winding inductively coupled to said second transformer first winding, said second transformer second winding connected to a high impedance port, said first reactive impedance being connected between said first transformer second winding and said second transformer second winding, said second reactive impedance being connected between said low impedance port and ground.

3. A transformer circuit as set forth in claim 1 wherein each of said first and second transformers are autotransformers, said first winding of said first transformer being a primary winding and said second winding of said first transformer being a secondary winding, said first winding of said second transformer being a primary winding and said second winding of said second transformer being a secondary winding.

4. A transformer circuit as set forth in claim 3 wherein said first and second transformers each have a core resistance of about 32 ohms per turn squared.

5. A transformer circuit as set forth in claim 3 wherein said primary winding of said first transformer has about 5 turns, and said secondary winding of said first transformer has about 7.5 turns, said primary winding of said second transformer has about 4 turns and said secondary winding of said second transformer has about 6.5 turns.

6. A transformer circuit as set forth in claim 3 wherein said first transformer has a core resistance of about 32 ohms per turn squared and said second transformer has a core resistance of about 80 ohms per turn squared.

7. A transformer circuit as set forth in claim 3 wherein said primary winding of said first transformer has about 4.5 turns, and said secondary winding of said first transformer has about 6.5 turns, said primary winding of said second transformer has about 3 turns and said secondary winding of said second transformer has about 5.5 turns.

8. A transformer circuit as set forth in claim 3 wherein said primary winding of said first transformer has about 4.5 turns, and said secondary winding of said first transformer has about 6.0 turns, said primary winding of said second transformer has about 2.5 turns and said secondary winding of said second transformer has about 5.0 turns.

9. A transformer circuit as set forth in claim 3, each of said first and second transformers having a miniature ferrite core with a pair of spaced apertures and first and second windings wound through said apertures on said core.

10. A transformer circuit as set forth in claim 9 wherein said windings include a twisted pair wound on said core forming 2.5 turns of each of said first and second transformers.

11. A transformer circuit as set forth in claim 9 wherein said windings include a twisted pair wound on said core forming 2.0 turns for said first transformer and 2.5 turns for said second transformer.

12. A transformer circuit as set forth in claim 5 wherein said windings include a twisted pair wound on said core forming 1.5 turns for said first transformer and 2.5 turns for said second transformer.

13. A transformer circuit as set forth in claim 1 wherein said first reactive impedance is an inductor.

14. A transformer circuit as set forth in claim 1 wherein said first reactive impedance is an inductor, said inductor is a single strand enamel coated magnet wire wound on a phenolic toroid core.

15. A transformer circuit as set forth in claim 1 wherein said first reactive impedance is an inductor of about 2.7 nanohenries.

16. A transformer circuit as set forth in claim 1 wherein said first reactive impedance is an inductor of about 4.8 nanohenries.

17. A transformer circuit as set forth in claim 1 wherein said second reactive impedance is a capacitor.

18. A transformer circuit as set forth in claim 1 wherein said second reactive impedance is a capacitor having a value of about 1 picofarad.

19. A transformer circuit as set forth in claim 1 wherein said second reactive impedance is a capacitor having a value of about 1.8 picofarad.

20. A transformer circuit as set forth in claim 1 wherein said second reactive impedance is a capacitor having a value of about 2.2 picofarad.

21. A transformer circuit as set forth in claim 1 including a balun connected to said high impedance port to provide a balanced output.

22. A transformer circuit as set forth in claim 21 wherein said balun has a 1:1 ratio.

23. A transformer circuit as set forth in claim 1 wherein there is provided about a 1:9 impedance ratio at a bandwidth of about 5 MHz to 1.2 GHz.

24. A transformer circuit as set forth in claim 1 wherein there is provided about a 1:12 impedance ratio at a bandwidth of about 10 MHz to 1000 MHz.

25. A transformer circuit as set forth in claim 1 wherein there is provided about a 1:16 impedance ratio and a bandwidth of about 10 MHz to 600 MHz.

26. A high impedance ratio wideband transformer circuit comprising:

a first transformer having a primary winding connected to a low impedance port and having a secondary winding, a second transformer having a primary winding and a secondary winding connected to a high impedance port, a first reactive impedance connected between said first transformer secondary winding and said second transformer primary winding, and a second reactive impedance connected between said low impedance port and ground, the values of said first and second reactive impedances being selected to optimize an impedance match from said low impedance port to said high impedance port for a turns ratio of said transmission line transformer means and a desired transformation ratio and frequency response to provide transformation ratio of above about 4:1 over a range of frequencies of about 5 MHz to 1.2 MHz, said first and second transformers being connected in series in a configuration with said secondary winding of said first transformer connected to said primary winding of said second transformer so that the impedance ratio of the first transformer is multiplied by the impedance ratio of the second transformer to reduce the length of said secondary windings of said first and second transformers, thereby increasing the range of frequency.

* * * * *